(12) United States Patent
Bauer et al.

(10) Patent No.: US 7,629,660 B2
(45) Date of Patent: Dec. 8, 2009

(54) SEMICONDUCTOR SENSOR COMPONENT INCLUDING A SENSOR CHIP AND METHODS FOR THE MANUFACTURING THEREOF

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 11/446,253

(22) Filed: Jun. 2, 2006

(65) Prior Publication Data

US 2006/0273420 A1    Dec. 7, 2006

(30) Foreign Application Priority Data

Jun. 2, 2005    (DE)    ........................ 10 2005 025 754

(51) Int. Cl.
*H01L 31/16*    (2006.01)

(52) U.S. Cl. ........................ 257/433; 257/432; 257/687; 257/678; 250/239; 250/216

(58) Field of Classification Search ........................ None
See application file for complete search history.

(56) References Cited

U.S. PATENT DOCUMENTS

| | | | |
|---|---|---|---|
| 6,100,595 A | 8/2000 | Jaouen et al. | |
| 6,627,872 B1* | 9/2003 | FuKamura et al. | 250/239 |
| 7,129,571 B2* | 10/2006 | Kang | 257/678 |
| 7,235,833 B2* | 6/2007 | Chen | 257/294 |
| 2001/0048064 A1* | 12/2001 | Kitani | 250/208.1 |
| 2004/0063304 A1* | 4/2004 | Hagen et al. | 438/613 |

FOREIGN PATENT DOCUMENTS

| | | |
|---|---|---|
| DE | 10144467 A1 | 4/2003 |
| DE | 10205127 A1 | 8/2003 |
| DE | 10325029 A1 | 1/2005 |
| JP | 11233810 | 8/1999 |
| WO | WO02/093642 | 11/2002 |

* cited by examiner

*Primary Examiner*—Minh-Loan T Tran
*Assistant Examiner*—Fei Fei Yeung Lopez
(74) *Attorney, Agent, or Firm*—Dicke, Billig, Czaja, PLLC

(57) ABSTRACT

A semiconductor sensor component including a sensor chip and methods for the manufacturing thereof is disclosed. In one embodiment, the semiconductor sensor component includes a package which itself includes a transparent plastic material. The sensor chip has an active top side and a back side, wherein a sensor area is arranged on the active top side and flipchip contacts are provided outside of the sensor area on the active top side. These flipchip contacts are electrically connected to a circuit structure, wherein the circuit structure allows free access to the sensor area. The sensor chip including the sensor area and the flipchip contacts and a part of the circuit structure which is electrically connected to the flipchip contacts are embedded in the transparent plastic material, wherein the transparent plastic material includes a rubber-elastic substance.

16 Claims, 3 Drawing Sheets

SEMICONDUCTOR SENSOR COMPONENT INCLUDING A SENSOR CHIP AND METHODS FOR THE MANUFACTURING THEREOF

CROSS-REFERENCE TO RELATED APPLICATIONS

This Utility Patent Application claims priority to German Patent Application No. DE 10 2005 025 754.2 filed on Jun. 2, 2005, which is incorporated herein by reference.

BACKGROUND

The invention relates to a semiconductor sensor component including a sensor chip and methods for the manufacturing thereof. The semiconductor sensor component additionally includes a package in which is arranged the sensor chip including its active top side and a back side, the sensor chip being electrically connected to a circuit structure of the package.

FIELD OF THE INVENTION

Such a sensor component is disclosed in the publication DE 102 05 127. In the known sensor component, the sensor chip includes flipchip contacts and a sensor area, wherein the flipchip contacts are arranged on the active top side in a peripheral area outside of the sensor area and the sensor chip including its flipchip contacts is embedded in a non-transparent plastic package material, wherein the flipchip contacts are electrically connected to a wiring structure which itself includes an opening such that the sensor area is freely accessible. An annular metal structure is arranged around this opening, surrounding the sensor area and being fixed directly onto the active top side of the sensor chip and onto the circuit structure. The sensor chip, including its back side, edge sides and the areas in which the flipchip contacts are arranged on the active top side, is embedded in a non-transparent plastic package material.

Such a semiconductor sensor component has the disadvantage that the thermal expansion coefficient of the non-transparent plastic package material is greater than the thermal expansion coefficient of the sensor chip, and therefore significant strain occurs under thermal load. Moreover, the sensor chip is rigidly mechanically connected to the circuit structure by the metallic ring around the sensor area, such that no provision is made for mechanical separation between the sensor area and circuit structure and therefore package stresses are transmitted directly onto the sensitive area of the active top side of the sensor chip. This results in a significant tolerance in the sensor characteristics of such semiconductor sensor components.

However, there is a requirement to minimize the tolerance in the sensor characteristics of the sensor components in a production lot in order to increase the reliability of the sensor components.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

SUMMARY

Figure 1:
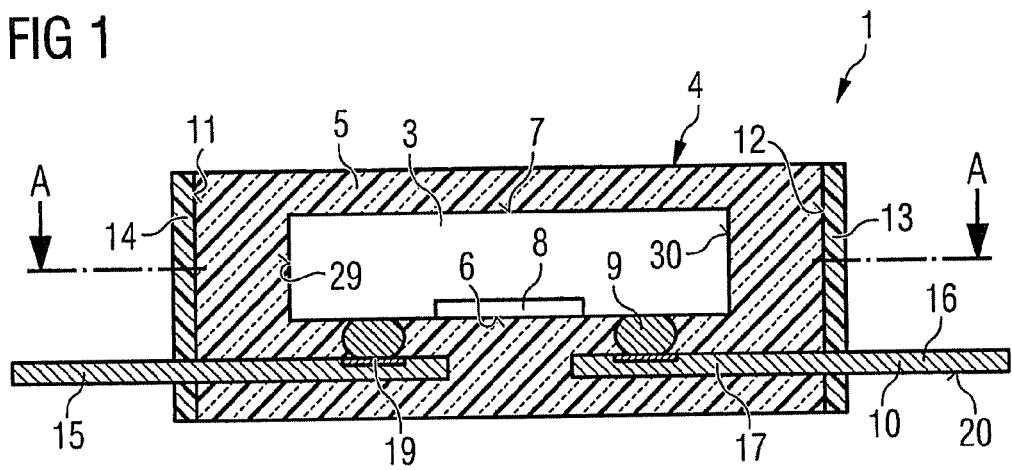
FIG. 1 illustrates a schematic cross section through a semiconductor sensor component corresponding to a first embodiment of the invention.

The present invention provides a semiconductor sensor component including a sensor chip and methods for the manufacturing thereof. In one embodiment, the semiconductor sensor component includes a package which itself includes a transparent plastic material. The sensor chip has an active top side and a back side, wherein a sensor area is arranged on the active top side and flipchip contacts are provided outside of the sensor area on the active top side. These flipchip contacts are electrically connected to a circuit structure, wherein the circuit structure allows free access to the sensor area. The sensor chip including the sensor area and the flipchip contacts and a part of the circuit structure which is electrically connected to the flipchip contacts are embedded in the transparent plastic material, wherein the transparent plastic material includes a rubber-elastic substance.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor sensor component and a method for the manufacturing thereof, wherein the component allows greater separation between sensor area and circuit structure and can be manufactured at lower manufacturing costs while offering greater reliability.

According to one embodiment of the invention, a semiconductor sensor component including a sensor chip and a package is provided. This package includes a transparent plastic material. The semiconductor chip has an active top side and a back side, wherein the active top side illustrates a sensor area. Flipchip contacts are arranged outside of the sensor area on the active top side of the semiconductor chip. These flipchip contacts are electrically connected to a circuit structure. In this case, the circuit structure is arranged such that it allows free access to the sensor area. The semiconductor chip with sensor area, the flipchip contacts and that part of the circuit structure which is electrically connected to the flipchip contact are embedded in the transparent plastic material. The transparent plastic material includes a rubber-elastic substance.

This semiconductor sensor component has the advantage that it includes a relatively compact construction, and an extensive mechanical separation between the circuit structure and the sensor chip is ensured. A further advantage is that the semiconductor chip, the sensor area, the flipchip contacts and that part of the circuit structure which is electrically connected to the flipchip contacts can be embedded with relative ease in a transparent rubber-elastic plastic material in order to form the package.

In order to improve the dimensional stability of the package of the semiconductor sensor component, a preferred embodiment of the invention provides for surrounding the transparent plastic material at least on the edge sides by a package frame of a non-transparent plastic package material while leaving the sensor area free. This non-transparent plastic frame is correspondingly distant from the central sensor area of the sensor chip and is used for positioning and retaining the circuit structure and for delimiting the transparent plastic material on its edge sides. Furthermore, the non-transparent relatively rigid plastic package material facilitates the incorporation or embedding of the sensor chip with flipchip contacts and parts of the circuit structure into the transparent plastic material.

In a one embodiment of the invention, the circuit structure has flat conductors, wherein outer flat conductors project outwards from the package and merge into inner flat conductors which are arranged within the transparent plastic material, wherein the flipchip contacts are fixed onto the inner flat conductors and the transparent plastic package material embeds the inner flat conductors, the flipchip contacts, the sensor area and the sensor chip.

This embodiment of the invention has the advantage that the flat conductors can be formed as thin metal film strips such that the flipchip contacts which are fixed onto them and the sensor chip in the rubber-elastic transparent plastic material are freely moveable and consequently a mechanical separation is made possible in relation to a rigid package frame of non-transparent plastic package material. In this case, the inner flat conductors are structured in such a way that they extend from the outer flat conductors through the transparent rubber-elastic plastic package material only as far as the flipchip contacts, such that the sensor area remains freely accessible for optical waves and compressional waves. In this case, the transparency of the transparent plastic material allows an optical link between sensor area and environment, and the rubber-elastic properties of the plastic package material ensure that compressional waves reach the sensor area and can be converted by the sensor area into corresponding electrical signals which can then be transmitted via the flipchip contacts and the relatively flexible film-type metallic inner flat conductors to the stable outer flat conductors.

In another embodiment of the invention, a TAB film (a film for "tape automated bonding") is used as a circuit structure. For this, the TAB film has an opening which corresponds in its surface extent to the sensor area of the sensor chip, such that access to the sensor area advantageously remains free for optical or pressure-based measurement objects. Around the opening, the film additionally has contact terminal pads to which the flipchip contacts are fixed. As a result of the inherent flexibility of the TAB film including the contact terminal pads and conductor paths which are situated thereon, a mechanical separation is also achieved between electrical leads and sensor area via the flipchip contacts in this second embodiment of the invention. In order to carry the electrical measurement signals to the exterior of the semiconductor sensor component by means of the TAB film, external contact pads are arranged on the external side of the film, thereby forming external contacts of the semiconductor sensor component.

In another embodiment of the invention, the circuit structure has a wiring substrate, wherein the wiring substrate has an opening which corresponds in its surface extent to the sensor area of the sensor chip. Such a wiring substrate does not have the flexibility of a TAB film, but a rigid wiring substrate can nonetheless be advantageous in certain application scenarios, e.g. in order to maintain a reference level or a reference surface as a reference level in the case of pressure measurements, such that the sensor chip can perform vibrational oscillations at least in the sensor area. Again in the case of the wiring substrate, contact terminal pads to which the flipchip contacts are fixed are advantageously arranged in the peripheral area of the opening.

In the case of the TAB film and the wiring substrate as coupling elements between the flipchip contacts and external contacts, external contact pads are arranged on the respective underside of the TAB film on corresponding external contact pads or on the underside of the wiring substrate, and external contacts of the semiconductor sensor component are fixed thereto. Such external contacts can preferably be surface-mountable soldering globules. Such surface-mountable soldering globules have the advantage that the footprint on a superordinate circuit board need be no larger than the external dimensions of the semiconductor sensor component, in particular since the whole underside of the semiconductor sensor component can be populated with such soldering globules as far as the opening which must be kept free towards the sensor area. Furthermore, the underside of the wiring structure can include a structured solder resist layer which leaves external contact pads free, wherein the structured solder resist layer ensures that the conductor paths to the contact terminal pads within the semiconductor sensor component are not wetted during the surface assembly.

A method for manufacturing semiconductor sensor components corresponding to the first embodiment of the invention has the following method processes.

A semiconductor wafer is manufactured including a plurality of sensor chip positions which are arranged in rows and columns, wherein the active top sides in the sensor chip positions have sensor areas and contact pads and wherein the back sides are arranged on the back side of the semiconductor wafer and opposite to these active top sides. Still at the wafer level, flipchip contacts outside of the sensor area can be mounted on the active top sides of the semiconductor chips in the sensor chip positions. The semiconductor wafer is then divided into sensor chips having flipchip contacts.

Independently of the manufacture of a semiconductor wafer, a flat-conductor frame including a plurality of semiconductor component positions is prepared as a circuit structure for the first embodiment of the invention. Package frames of a non-transparent plastic package material are mounted in the individual semiconductor component positions on this flat-conductor frame, wherein the side walls of a package frame for a semiconductor sensor component package are formed including inner flat conductors which project into the package frame and outer flat conductors which project out of the package frame. The flat-conductor frame including a plurality of semiconductor component positions is then populated with sensor chips within the package frames, fixing the flipchip contacts onto the inner flat conductors of the flat-conductor frame and leaving the sensor areas free.

The sensor chips including the sensor areas, the flipchip contacts and the inner flat conductors are then embedded in a transparent plastic material within the package frame. Finally, the flat-conductor frame can then be divided into individual semiconductor sensor components. This method has the advantage that a semiconductor sensor component or a plurality of semiconductor sensor components is/are produced in a simple manner using standard method processes while nonetheless allowing different expansion of the transparent plastic package material within the rigid frame of non-transparent plastic package material, wherein the sensor areas and sensor chips of the semiconductor sensor component(s) are mechanically separated from the rigid package frame, the inner flat conductors having a film-type cross section in order to ensure this mechanical separation.

The division of the flat-conductor frame is preferably carried out by means of stamping, which is a proven technology, in order to dice the flat-conductor frame.

In a method for manufacturing a semiconductor sensor component corresponding to the second embodiment of the invention, the sensor chips with flipchip contacts and sensor areas are initially produced from a semiconductor wafer in exactly the same way as during production of semiconductor sensor components as per the first embodiment of the invention. Instead of a flat-conductor frame, however, a TAB film with a plurality of semiconductor component positions is prepared as a circuit structure, wherein the TAB film has openings in the semiconductor component positions, the openings corresponding in their surface extent to the sensor areas of the sensor chips.

Such openings are not usual in conventional TAB films, but can be incorporated in a conventional TAB film by means of a simple stamping or cutting process. The mounting of sensor chips onto the top side of the TAB film, fixing the flipchip contacts to contact terminal pads of the top side of the TAB film in the area of the openings, can preferably be carried out using an automatic insertion machine. The sensor chip including the sensor area, the flipchip contacts and that part of the TAB film in the area of the openings are then embedded in a transparent plastic material. External contacts can then be mounted on corresponding external contacts of the TAB film on the back sides or undersides of the TAB film. Finally, the TAB film is divided into individual semiconductor sensor components. This method provides a semiconductor sensor component which allows the most advantageous mechanical separation yet between sensor chip and sensor package.

A method for manufacturing semiconductor sensor components corresponding to the third embodiment of the invention has the following method processes.

The same method processes as in the two previous methods are carried out in order to manufacture the sensor chips themselves, while the preparation of a wiring substrate including a plurality of semiconductor component positions as a circuit structure differs from the previous method processes. Specifically, openings which are not conventionally usual are incorporated in the semiconductor component positions in the wiring substrate, wherein the surface extent of the openings corresponds at least to the sensor areas of the sensor chips. The top side of the wiring substrate is then fixed to the sensor chips in the area of the openings, fixing the flipchip contacts onto corresponding contact terminal pads on the top side of the wiring substrate.

The sensor chips including the sensor area, the flipchip contacts and the wiring substrate in the area of the openings are then embedded in a transparent plastic package material. External contacts can then be mounted on external contact pads of the underside of the wiring substrate, before the wiring substrate is finally divided into individual semiconductor sensor components.

In this embodiment of the invention, it is again advantageous if the insertion of sensor chips in semiconductor component positions is carried out by means of an automatic insertion machine, wherein the sensor chips including their active top sides and flipchip contacts are fixed onto the circuit structure by means of soldering. For this, the top side of the wiring substrate includes a solder resist layer which leaves only the contact terminal pads free and prevents corresponding conductor paths of the wiring structure of the wiring substrate from being wetted with material from the flipchip contacts.

The embedding of the sensor chips in a transparent plastic material can be done advantageously by means of dispensing techniques. The deposition of a package frame of a non-transparent relatively rigid plastic package material, forming side walls on the transparent plastic package material, can be done advantageously by means of injection molding techniques for a plurality of semiconductor sensor components on the wiring substrate. The deposition of a wiring structure on the top side of the TAB film or on the top side of the wiring substrate can be done by depositing a continuous metal layer and then structuring by means of photolithography and etching techniques.

In summary, the manufacture of the sensor package for mounting flipchip contacts allows many different possibilities for a flexible connection between semiconductor sensor chip and package. In this case, anisotropically conductive adhesive films and TAB films can be used for inexpensive assembly designs.

The cover height above the sensor area can be checked more easily and therefore a narrower window for the sensor properties is possible. It is also possible to achieve a flatter package because no bonding wires are required for connecting the sensor chips to the circuit structure. Consequently, this invention clearly improves the possibilities relating to assembly and reduced divergence of the sensor sensitivities.

FIG. 1 illustrates a schematic cross section through a semiconductor sensor component 1 corresponding to a first embodiment of the invention. The semiconductor sensor component 1 includes a sensor chip 3 including a back side 7 and an active top side 6, wherein a sensor area 8 is arranged on the active top side 6 and contact pads 27 are present in the peripheral area of the active top side 6. Fixed onto the contact pads 27 of the active top side 6 of the semiconductor chip 3 are flipchip contacts 9, via which the semiconductor chip 3 or the active top side 6 of the semiconductor chip 3 is connected to a circuit structure 10 consisting of flat conductors 15. This circuit structure 10 of flat conductors 15 includes thin flexible inner flat conductors 17 and reinforced outer flat conductors 16 which also represent the external terminals for the semiconductor sensor component 1. The flat conductors 15 of the circuit structure 10 are held in position by a rigid package frame 13 made of a non-transparent plastic package material 14.

Within the package frame 13, the semiconductor sensor component includes a transparent rubber-elastic plastic material 5 as a package 4 of the semiconductor sensor component 1, wherein the inner flat conductors 17 and the whole sensor chip 3 including its back side 7, its edge sides 29 and 30, its active top side 6, the central sensor area 8, the peripheral areas and the flipchip contacts 9 which are arranged thereon are embedded in the transparent rubber-elastic plastic material 5. This embedding of the whole sensor chip 3 in a rubber-elastic transparent plastic material 5 has the advantage that a mechanical separation from the outer flat conductors 16 and the rigid package frame 13 is possible. The transparent rubber-elastic plastic material with its edge sides 11 and 12 abuts the rigid package frame 13. The sensor area 8, which is kept clear of the inner flat conductors 17, can therefore detect both optical and mechanical waves and transmit the waves as measurement signals on the outer flat conductors 16 via the flipchip contacts 9 and the inner flat conductors 17.

Figure 2:
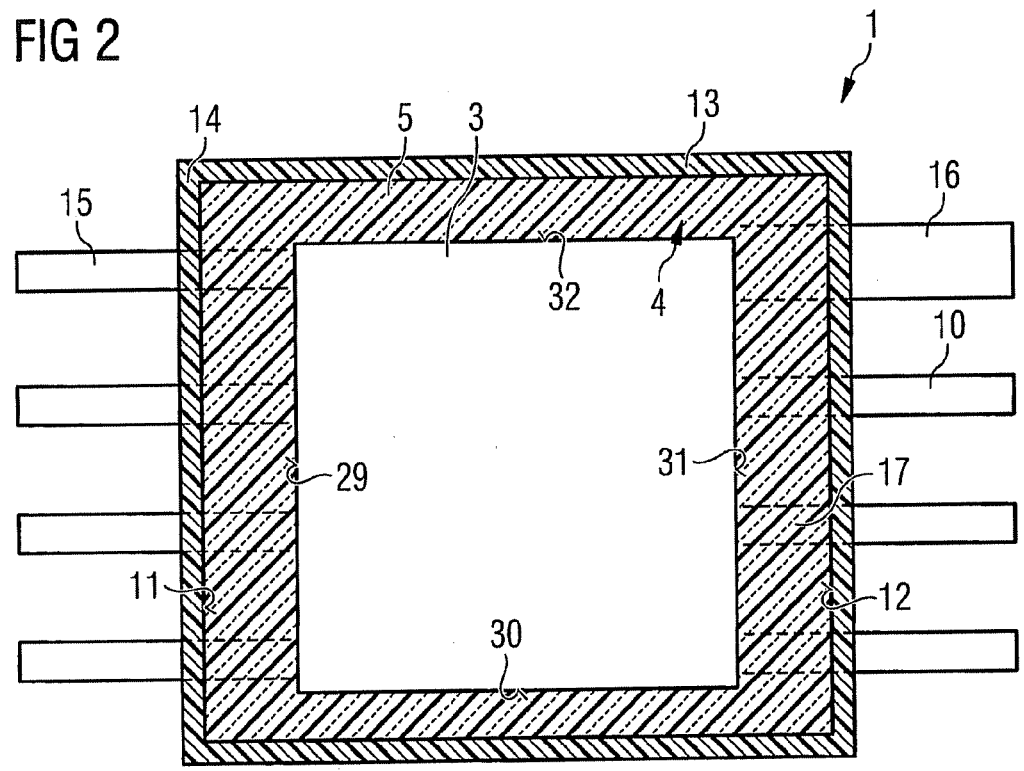
FIG. 2 illustrates a schematic longitudinal section along the section line A-A from FIG. 1 through the semiconductor sensor component from FIG. 1.

FIG. 2 illustrates a schematic longitudinal section along the section line A-A from FIG. 1 through the semiconductor sensor component 1. It can be seen from this longitudinal section that the sensor chip 3 with its edge sides 29 to 32 is embedded in the rubber-elastic transparent plastic material 5, and is completely surrounded by this rubber-elastic transparent plastic material 5, in a manner which allows full freedom of vibration. The inner flat conductors 17 are illustrated by means of broken lines and are formed correspondingly as thin film strips in order to ensure a mechanical separation between the rigid package frame 13 and the flipchip contacts which are not visible in FIG. 2.

Figure 3:
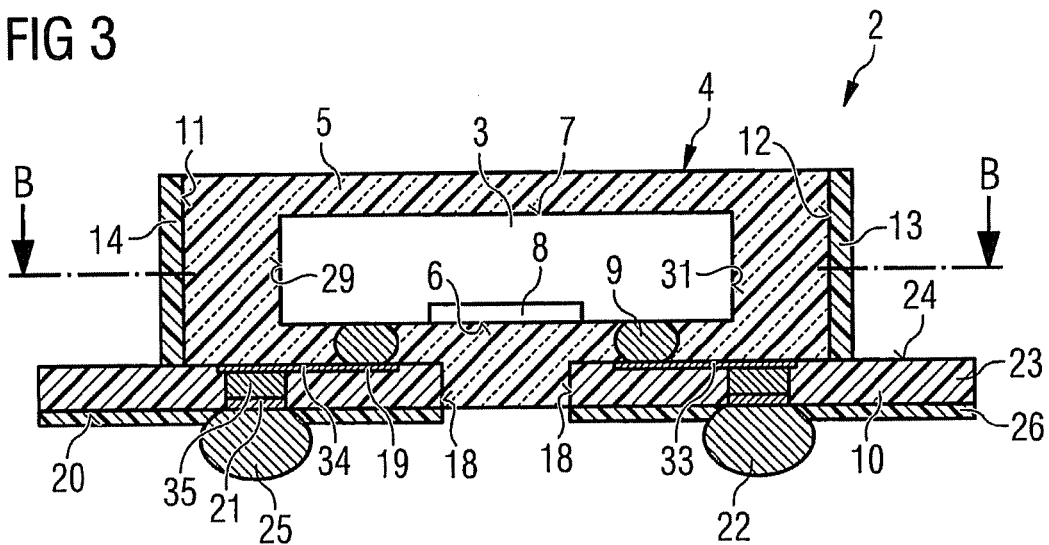
FIG. 3 illustrates a schematic cross section through a semiconductor sensor component corresponding to a second embodiment of the invention.

FIG. 3 illustrates a schematic cross section through a semiconductor sensor component 2 corresponding to a second embodiment of the invention. Components having identical functions as in FIGS. 1 and 2 are identified by means of the same reference numerals and are not discussed separately.

In this embodiment of the invention, the circuit structure 10 is implemented by means of a wiring substrate 23 and/or by means of a TAB film. In the case of the wiring substrate 23, the flexibility relative to the sensor chip 3 is less than in the first embodiment of the invention. If the wiring substrate 23 is replaced by a TAB film, however, it is possible to achieve mechanically extremely flexible connections to the external terminals of the semiconductor sensor component 2.

In the case of the wiring substrate 23, a wiring structure 33 is arranged on the top side 24 of the wiring substrate 23 as illustrated in FIG. 3. This wiring structure 33 has contact terminal pads 19 which are connected via conductor paths 34 to through contacts 35 through the wiring substrate 23, wherein external contact pads 21 are arranged on the underside 20 of the wiring substrate 23 and carry external contacts 22 in the form of soldering globules 25 in this embodiment of the invention. The external contacts 21 are delimited locally by means of a surrounding solder resist layer 26 on the underside 20 of the wiring substrate 23. Opposite to the sensor area 8 of the semiconductor chip 3, provision is made in the wiring substrate 23 for an opening 18 whose surface extent corresponds to the surface extent of the sensor area 8 such that optical waves can reach the sensor area 8 by virtue of the transparency of the rubber-elastic and transparent plastic material 5 of the package 4.

Figure 4:
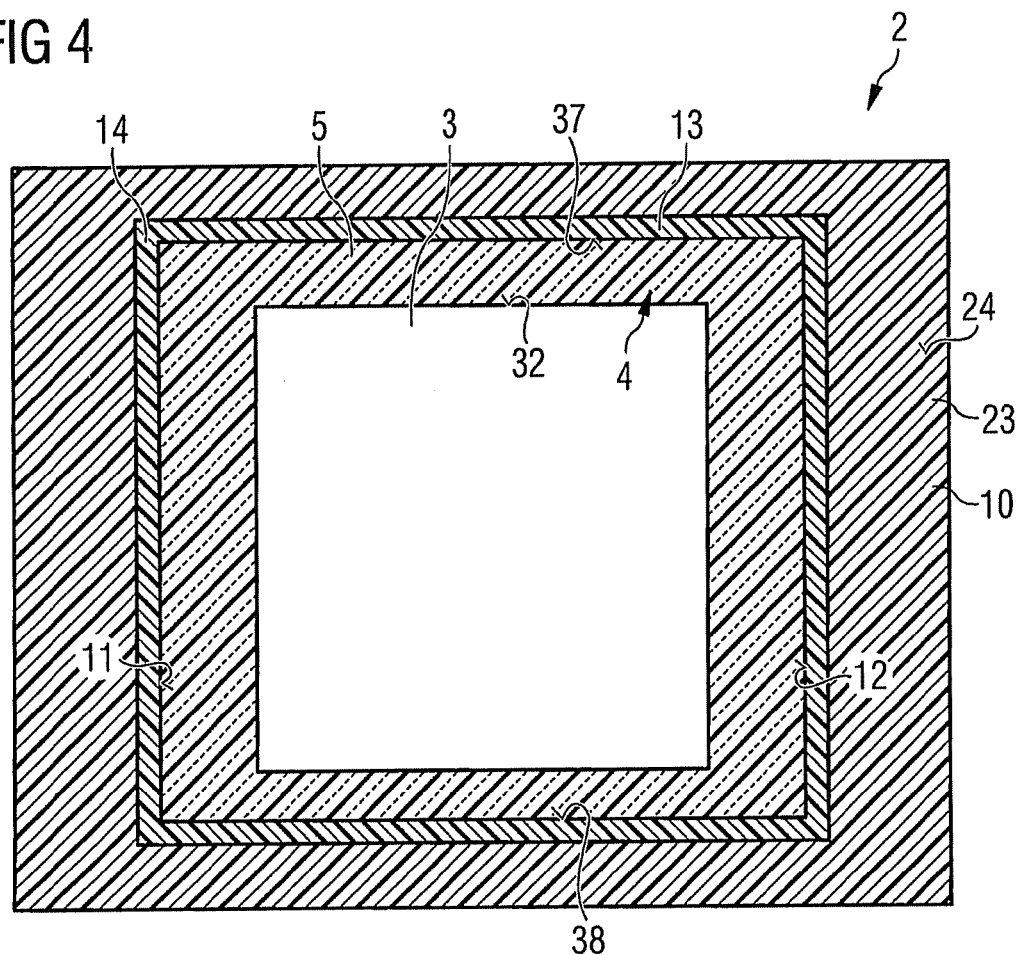
FIG. 4 illustrates a schematic longitudinal section along the section line B-B from FIG. 3 through the semiconductor sensor component from FIG. 3.

FIG. 4 illustrates a schematic longitudinal section along the section line B-B from FIG. 3 through the semiconductor sensor component 2. Again in this case, the sensor chip 3 is completely surrounded by transparent and rubber-elastic plastic material 5, wherein a rigid package frame 13 provides the lateral delimitation of this rubber-elastic and transparent plastic material 5 at the edge sides 11, 12, 37, 38. This rigid package frame 13 has a plastic package material 14 which is arranged on the top side 24 of the wiring substrate 23 as illustrated in FIG. 3. Consequently, the edge sides 29, 30, 31, 32 of the sensor chip 3 are completely surrounded by the transparent plastic material 5 and arranged at a distance from the rigid package frame 13.

Figure 5:
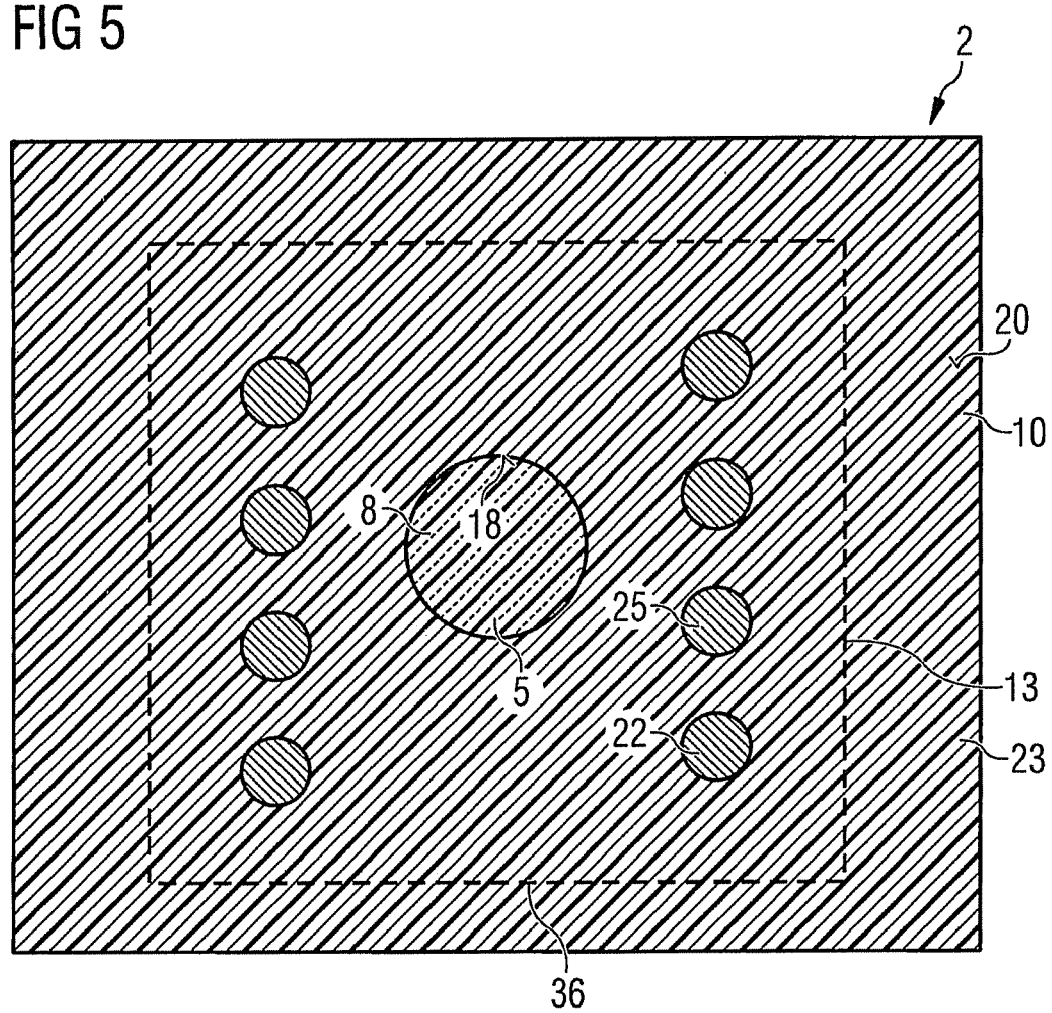
FIG. 5 illustrates a schematic bottom view of the semiconductor sensor component as per FIG. 3.

FIG. 5 illustrates a schematic bottom view of the semiconductor sensor component 2 from FIG. 3. The broken line 36 illustrates the outline of the rigid package frame 13, while the opening 18 in the center of the wiring substrate 23 is filled by the transparent plastic material 5. External contacts 22 in the form of soldering globules 25 are arranged on the underside 20 of the wiring substrate 23 and represent the external contacts 22 of the semiconductor sensor component 2, such that the respective measurement signals can be picked up or supply voltages applied to the sensor chip at these points.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor sensor component comprising:
a sensor chip; and
a package which comprises a transparent plastic material, wherein the sensor chip comprises a plurality of edge sides, an active top side, a back side, and a sensor area on the active top side and flipchip contacts outside of the sensor area, the flipchip contacts being electrically connected to a circuit structure, wherein the circuit structure allows free access to the sensor area, wherein the sensor chip, including the back side, edge sides, front side; and sensor area, and the flipchip contacts and that part of the circuit structure which is electrically connected to the flipchip contacts are encased within and in direct contact with the transparent plastic material, wherein the transparent plastic material comprises a rubber-elastic plastic material having properties which enable the sensor to receive and convert optical waves and compressional waves into representative electrical signals, and wherein the transparent plastic material is surrounded at least on the edge sides by a package frame of a non-transparent plastic package material, and wherein the circuit structure includes one more conductors extending through the package frame, each conductor comprising a rigid portion external to the package frame and a flexible portion within an interior of the package frame containing the transparent plastic material.

2. The semiconductor sensor component as claimed in claim 1, wherein the package frame leaves the sensor area free, the sensor chip, including the back side, being separated from the non-transparent packaging material by the transparent material in which the sensor chip is encased.

3. The semiconductor sensor component as claimed in claim 1, wherein the circuit structure comprises flat conductors, wherein outer flat conductors project outwards from the package and merge into inner flat conductors which are arranged within the transparent plastic material, wherein the flipchip contacts are fixed onto the inner flat conductors.

4. The semiconductor sensor component as claimed in claim 1, wherein the circuit structure comprises a TAB film, wherein the TAB film comprises an opening which corresponds in its surface extent to the sensor area of the sensor chip.

5. The semiconductor sensor component as claimed in claim 4, wherein around the opening of the film are arranged contact terminal pads on which the flipchip contacts are fixed.

6. The semiconductor sensor component as claimed in claim 1, wherein external contact pads are arranged on the underside of the film, thereby forming external contacts of the semiconductor sensor component.

7. The semiconductor sensor component as claimed in 1, wherein the circuit structure comprises a wiring substrate, wherein the wiring substrate comprises an opening which corresponds in its surface extent to the sensor area of the sensor chip.

8. The semiconductor sensor component as claimed in claim 7, wherein around the opening on the top side of the wiring substrate are arranged contact terminal pads on which the flipchip contacts are fixed.

9. The semiconductor sensor component as claimed in claim 7, wherein the wiring substrate on its underside comprises external contact pads to which external contacts of the semiconductor sensor component are fixed.

10. The semiconductor sensor component as claimed in claim 6, wherein the external contacts have surface-mountable solder balls.

11. The semiconductor sensor component as claimed in claim 9, wherein a structured solder resist layer is arranged on the underside of the wiring substrate, while leaving external contact pads free.

12. A semiconductor sensor component comprising:
a rigid plastic package frame having perimeter sides which form an interior space having an open top and an open bottom;
a semiconductor chip disposed within the interior space and having an active top side and a back side, the active top side having a sensor area and flip chip contacts outside the sensor area;
a plurality of conductors extending through the perimeters side of the package frame from an exterior to the interior space, each conductors comprising a rigid portion exterior to the package frame and transitioning to a flexible portion within the interior space, the flexible portions connected to the flip chip contacts in a fashion which allows free access to the sensor area; and
a transparent rubber-elastic plastic material filling the interior space so that the semiconductor chip, the flexible portions of the conductors, and the flip-chip contacts are encased within the transparent rubber-elastic plastic material, wherein the open top and open bottom of the plastic frame, the flexible portions of the conductors, and the transparent rubber-elastic plastic material enable the sensor area to receive optical waves and acoustical waves.

13. The semiconductor sensor component of claim 12, wherein the active top side and back side are positioned perpendicular to the perimeter sides of the package frame.

14. The semiconductor sensor component of claim 12, wherein the sensor area comprises an optical sensor area configured to receive and convert optical waves to a representative electrical signal.

15. The semiconductor sensor component of claim 12, wherein the sensor area comprises a compressional sensor area configured to receive and convert compressional waves to a representative electrical signal.

16. A semiconductor sensor component comprising:
a sensor chip comprising a plurality of edge sides, an active top side, a back side, and including on the active top side a sensor area with flipchip contacts outside of the sensor area; and
a package comprising:
a package frame of a non-transparent plastic material surrounding at the least the edge side of the sensor chip and forming an interior space in which the sensor chip is disposed;
a circuit structure electrically connected to the flipchip contacts, the circuit structure including one or more conductors extending through the package frame, each conductor comprising a rigid portion external to the package frame and a flexible portion within the interior of the package frame, the circuit structure allowing free access to the sensor area; and
a transparent rubber-elastic material filling the interior space of the package frame such that the back side, edge sides, front side; and sensor area, and the flipchip contacts and that part of the circuit structure which is electrically connected to the flipchip contacts are encased within and in direct contact with the transparent plastic material.

* * * * *